US010844262B2

(12) United States Patent
Dushatinski et al.

(10) Patent No.: US 10,844,262 B2
(45) Date of Patent: Nov. 24, 2020

(54) BNNT THERMAL MANAGEMENT MATERIALS FOR HIGH-POWER SYSTEMS

(71) Applicant: BNNT, LLC, Newport News, VA (US)

(72) Inventors: Thomas G. Dushatinski, Newport News, VA (US); Thomas W. Henneberg, Newport News, VA (US); Clay F. Huff, Newport News, VA (US); Kevin C. Jordan, Newport News, VA (US); Jonathan C. Stevens, Williamsburg, VA (US); Michael W. Smith, Newport News, VA (US); R. Roy Whitney, Newport News, VA (US); Lyndsey R. Scammell, Newport News, VA (US); Alex I. Wixtrom, Newport News, VA (US)

(73) Assignee: BNNT, LLC, Newport News, VA (US)

( * ) Notice: Subject to any disclaimer, the term of this patent is extended or adjusted under 35 U.S.C. 154(b) by 0 days.

(21) Appl. No.: 16/512,857

(22) Filed: Jul. 16, 2019

(65) Prior Publication Data

US 2020/0283669 A1   Sep. 10, 2020

Related U.S. Application Data

(63) Continuation of application No. PCT/US2019/018547, filed on Feb. 19, 2019.

(60) Provisional application No. 62/632,349, filed on Feb. 19, 2018.

(51) Int. Cl.
*C01B 21/064* (2006.01)
*C09K 5/14* (2006.01)
*H01L 23/373* (2006.01)

(52) U.S. Cl.
CPC ............ *C09K 5/14* (2013.01); *C01B 21/0648* (2013.01); *H01L 23/3737* (2013.01)

(58) Field of Classification Search
CPC .................................................. C01B 21/0648
See application file for complete search history.

(56) References Cited

U.S. PATENT DOCUMENTS

| 6,864,571 | B2 | 3/2005 | Arik et al. |
| 9,745,192 | B2 | 8/2017 | Smith et al. |
| 9,776,865 | B2 | 10/2017 | Smith et al. |
| 10,167,195 | B2 | 1/2019 | Smith et al. |
| 2007/0241303 | A1 | 10/2007 | Zhong et al. |
| 2014/0080954 | A1 | 3/2014 | Raman et al. |
| 2016/0325994 | A1 | 11/2016 | Qu et al. |
| 2017/0253485 | A2* | 9/2017 | Kim .................... C01B 21/0641 |

FOREIGN PATENT DOCUMENTS

| WO | 2016/186721 | 11/2016 |
| WO | 2018/102423 | 6/2018 |

OTHER PUBLICATIONS

International Search Report and Written Opinion of the ISA for PCT/US2019/018547, dated May 8, 2019, 7 pages.
Yan et al., "Enhanced thermal-mechanical properties of polymer composites with hybrid boron nitride nanofilers", Applied Physics A., Feb. 2014, vol. 114, pp. 331-337.
Borjas-Ramos et al., "Thermal Conductivity of Nanocomposites Based in High Density Polyethylene and Surface Modified Hexagonal Boron Nitride via Cold Ethylene Plasma", Plasma Chemistry and Plasma Processing, Dec. 1, 2017, vol. 38, pp. 429-441.

* cited by examiner

*Primary Examiner* — Wenwen Cai
(74) *Attorney, Agent, or Firm* — Joshua B. Brady; Nixon & Vanderhye, P.C.

(57) ABSTRACT

Thermal interface materials may be enhanced through the dispersion of refined boron nitride nanotubes (BNNTs) into a polymer matrix material and one or more microfillers. A refined BNNT material may be formed by reducing free boron particle content from an as-synthesized BNNT material, and in some embodiments reducing h-BN content. Reducing these species improves the thermal conductivity of the BNNTs. Refined BNNTs may be deagglomerated to reduce the size and mass of BNNTs in agglomerations when the deagglomerated BNNT material is dispersed into a target polymer matrix material. The deagglomerated BNNT material may be lyophilized prior to dispersion in the matrix material, to retain the deagglomeration benefit following return to solid state. The surface of the deagglomerated BNNT material may be modified, with one or more functional groups that improve dispersibility and heat transfer in the target polymer matrix material.

36 Claims, 6 Drawing Sheets

Figure 1. Diagram of a typical electronics package, highlighting TIM1 (red) and TIM2 (blue).

BNNT THERMAL MANAGEMENT MATERIALS FOR HIGH-POWER SYSTEMS

CROSS REFERENCE TO RELATED APPLICATIONS

This application is Continuation of International Application No. PCT/US2019/018547 filed Feb. 19, 2019, which designated the U.S. and claims to the benefit of U.S. Provisional Patent Application No. 62/632,349, filed Feb. 19, 2018, the entire contents of each of which are hereby incorporated by reference.

FIELD OF THE INVENTION

The present disclosure relates to thermally conductive materials for thermal management, including thermal interface materials (TIMs) having boron nitride nanotubes (BNNTs), as well as methods for preparing BNNTs for use in TIMs.

BACKGROUND

As technological advances increase the power densities of modern electronics, heat accumulation becomes a critical performance limitation, reducing efficiency, lifetime, and lifecycle costs. Increasing performance demands for electronics are driving requirements for new thermal management architectures with advanced materials. Thermal management challenges have long been grappled with in systems, within communications systems, controls for more powerful, and quicker-response weapons systems (directed energy laser weapons, railguns), sensors (multi-sensor fusion), and the transport platforms/systems that carry, and often power, them all. Active thermal management, i.e., cooling, only partially solves such challenges, with improved performance offset by increased system weight, volume, power, and energy demands. Improved passive thermal management, on the other hand, dissipates heat and lowers semiconductor junction temperatures (Tj), which improves performance, prolongs component lifetimes, and decreases maintenance and other lifecycle costs. Passive cooling requires advanced materials to conduct heat from deep within circuits to heat sinks and other structures, and in such proximity to circuitry, only electrically-insulating materials may be used. The thermal conductivity of presently available frequently electrically-insulating materials is often inadequate, and these materials are often incompatible with mechanical requirements and fabrication processes. Improved TIMs are important to both improving the performance and lifespan of existing electronic devices, and also enabling the next generation of electronic devices and high-power systems.

Improved TIMs have the potential to benefit all electronics. The highest immediate value and logical first targets are higher-power components, such as power supplies, power converters, AC/DC components, and energy storage and other control systems. High power electronic systems and applications of interest include, for example, sensors such as phased array radar, communications systems (from the most complex high-power RF systems to those as ubiquitous as Wi-Fi), manned or unmanned transport systems, and weapons (especially prototype directed energy systems that cannot advance without solving heat/power conflicts). Improved TIMs are a critical next step towards realizing such devices.

What is needed, then, are improved thermal interface materials suitable for use in electronic devices. These improved TIMs must be both electrically-insulating and thermally conductive, over a broad range of operating temperatures, and have mechanical strength to endure fabrication and repetitive use.

SUMMARY

BNNTs have a number of properties that make them highly desirable for TIMs in electrical components, and may be used in embodiments of the present approach: They are electrically insulating, conduct heat nearly eight times better than copper, survive high temperatures (e.g., oxidation stability 700-900° C. verses carbon 350-550° C.), and molecular in scale, allowing incorporation deep within semiconductor electronics packages. BNNTs, particularly when synthesized from catalyst-free, high-temperature and high-pressure processes, have a high aspect ratio, through which heat may be efficiently conducted. BNNTs can enhance heat transfer within a material when used in conjunction with thermally-conductivity micro-particles and a polymer matrix. As described herein, BNNTs may be used to transform thermally-insulating polymers into thermally-conductive composites (e.g., over an order of magnitude improvement), without losing their vital electrical insulating properties. These BNNT composites may be used in BNNT-modified thermal interface materials, which will improve the performance, efficiency, and reliability of existing designs, and enable the next generation of higher power-density designs.

High quality BNNTs, such as those manufactured by BNNT, LLC of Newport News, Virginia, generally have few defects, no catalyst impurities, 1- to 10-walls with the peak in the distribution at 3-walls and rapidly decreasing with larger number of walls, and may be preferred as the starting or as-synthesized BNNT material for some embodiments of the present approach. Although dimensions may vary depending on the manufacturing process, BNNT diameters typically range from about 1.5 to about 6 nm, but of course may extend beyond this range. BNNT lengths typically range from a few hundreds of nm to hundreds of microns, but may extend beyond this range depending on, among many factors, the synthesis and collecting processes used to generate the as-synthesized BNNT material.

Previous patents and published applications have suggested the addition of materials including BNNTs into the materials used in electrical components. See, for example, U.S. Patent Publication US2014/0080954 A1 to Raman et al.; and U.S. Pat. No. 6,864,571 B2 to Arik et al. Neither reference describes BNNT materials useful in TIMs and other thermal management systems. Instead, the methods disclosed Raman merely suggest use of BNNTs in bulk, without any regard to synthesis and collection processes, modifications to the as-synthesized material for improving performance, or composite matrices with a BNNT component. Likewise, the methods disclosed by Arik merely suggest "generally aligned nanotubes that extend away from the catalyst layer" i.e. in the out-of-plane and similar out-of-plane heat transfer for limited aspects of the electrical components. Merely dispersing or including the BNNTs into the materials going into an electrical component is insufficient to enhance the thermal management in an electronic system as a general proposition, and wholly inadequate for inclusion in a TIM. The chemical vapor deposition (CVD) growth methods of Arik do not produce high quality BNNTs, i.e. few wall, high aspect ratio, minimal defects and catalyst free, as they take place at temperatures and nitrogen pressures far below what is required for high quality BNNTs.

Under the present approach, a thermal interface material may take the form of a composite matrix, such as a polymer composite matrix. The composite matrix may have a matrix material, a microfiller material, and a BNNT filler material. The TIM may include, but are not limited to, thermal management material form factors such as thermal greases (or "pastes"), adhesives, gap fillers (underfills), gap pads, topside coatings, and printed wiring board.

In some embodiments of the present approach, a BNNT material may be synthesized, deagglomerated, surface-modified, and dispersed within a matrix material. Under the present approach, a BNNT material may be synthesized according to known methods. This description refers to the BNNT material following synthesis as-synthesized BNNT material. Under the present approach, as-synthesized BNNT material may be synthesized according to known methods, and, depending on the synthesis method and conditions, the as-synthesized BNNT material may be low quality or high quality. High quality BNNTs may be preferred for at least some embodiments of the present approach. U.S. Pat. Nos. 9,745,192, 9,776,865, 10,167,195, and International Patent Application PCT/US16/23432, filed Nov. 21, 2017, describe examples of synthesis apparatus and processes for high-quality BNNTs, and each is incorporated by reference in its entirety. Depending on the embodiment, the surface of the synthesized BNNT material may be modified by one or more methods.

Synthesized BNNT material often includes numerous agglomerations, which can interfere with sufficient BNNT dispersion throughout the microfiller material. Thus, in some embodiments, synthesized BNNT material may deagglomerated, such as through one or more of the processes described herein.

Synthesized, deagglomerated BNNT material may also be lyophilized in some embodiments. For example, the BNNTs may be flash frozen in a solvent (water, organic solvent, or combinations thereof), and dried under a low pressure to remove the solvent through sublimation and/or evaporation, resulting in a dried, deagglomerated BNNT material. It should be appreciated that many deagglomeration methods may be used prior to lyophilization, including solvent-based methods and mechanical methods.

In some embodiments, the surface of the synthesized BNNT material may be modified through one or more chemical surface modifications. Depending on the embodiment, BNNT surface modification may occur prior to or after deagglomeration and dispersion of the BNNT. Depending on the embodiment, surface modification of BNNT may be covalent or noncovalent.

Some embodiments of the present approach may take the form of a thermal interface filler, containing refined and deagglomerated boron nitride nanotubes (BNNTs). Refined BNNT materials have reduced residual boron particulate content (not including boron trapped in h-BN nanocages), and in some embodiments the residual boron particle content of less than 20% by weight. In some embodiments, the residual boron particle content is less than 10% by weight, and in some embodiments, the residual boron particle content is less than 3% by weight, and can be less than 1% by weight in some embodiments. Deagglomerated BNNT materials have reduced BNNT agglomeration size and content. For example, in some embodiments, when dispersed in a polymer matrix material, less than 1% of any remaining agglomerations in the BNNTs have two dimensions that exceed 300 µm, as determined using the method described herein. In some embodiments, less than 5% of any remaining agglomerations in the BNNTs have two dimensions that exceed 200 µm. In some embodiments, less than 10% of any remaining agglomerations in the BNNTs have two dimensions that exceed 150 µm. In some embodiments, less than 15% of any remaining agglomerations in the BNNTs have two dimensions that exceed 100 µm. In some embodiments, less than 20% of any remaining agglomerations in the BNNTs have two dimensions that exceed 50 µm. In some embodiments, less than 25% of any remaining agglomerations in the BNNTs have two dimensions that exceed 25 µm.

BNNT material for thermal interface fillers in some embodiments of the present approach may have a residual boron particle content less than 3% by weight, and less than 1% of any remaining agglomerations in the BNNTs have two dimensions that exceed 300 µm. In some embodiments, the residual boron particle content is less than 1% by weight, and less than 10% of any remaining agglomerations in the BNNTs have two dimensions that exceed 150 µm. In some embodiments, the residual boron particle content is less than 1% by weight, less than 10% of any remaining agglomerations in the BNNTs have two dimensions that exceed 150 µm, and less than 5% of any remaining agglomerations in the BNNTs have two dimensions that exceed 200 µm.

In some embodiments, the refined BNNT material has a reduced content of h-BN allotropes, as determined using the method described herein. For example, the residual h-BN allotrope content is less than 30% in some embodiments, less than 10% t in some embodiments, and less than 3% in some embodiments.

Deagglomerated BNNT material may, in some embodiments, be lyophilized, to retain the benefits of deagglomeration when returning to solid form. In some embodiments, BNNTs may be surface modified with a functional group that improves dispersion in a polymer matrix material.

Some embodiments of the present approach may take the form of a thermal interface material, having a polymer matrix material, at least one microfiller; and a refined and deagglomerated BNNT. In some embodiments, the microfiller(s) are about 50% to about 90% by weight. In some embodiments, the refined and deagglomerated BNNT material comprises about 0.1% to about 30% by weight. In some embodiments, the thermal interface material may comprise a dielectric material.

In some embodiments, the present approach may take the form of a method for fabricating a BNNT-enhanced thermal interface material. For example, an as-synthesized BNNT material may be refined to remove (i.e., reduce the amount of) various boron species, such as boron particles, a-BN, and h-BN allotropes. The refined BNNT material may be deagglomerated, to reduce the size of BNNT agglomerations and the mass of BNNTs in agglomerations, to form deagglomerated BNNT material. It should be appreciated that a deagglomerated BNNT material will, when dispersed in the target polymer matrix, have fewer agglomerations and a BNNT material that has not been deagglomerated. The deagglomerated BNNT material may be dispersed into one or more microfillers and a polymer matrix material.

Refining the as-synthesized BNNT material may, in some embodiments, include heating the as-synthesized BNNT material in an inert gas and a hydrogen feedstock at a first temperature, which may be about 500° C. to about 650° C., for a first duration, which may be about 3 minutes to about 12 hours. In some embodiments, refining the as-synthesized BNNT material may also include heating the as-synthesized BNNT material at a second temperature, which may be about 650° C. to about 800° C., for a second duration, which may be about 3 minutes to about 12 hours.

Some embodiments may include lyophilizing the deagglomerated BNNT material prior to dispersing. In some embodiments, the BNNTs may have one or more surface modifications. For example, BNNTs may modified to include a functional group that improves dispersion in the polymer matrix material prior to dispersing.

BRIEF DESCRIPTION OF THE DRAWINGS

FIGS. 6A and 6B are, respectively, an SEM image and a TEM image of a BNNT material.

DETAILED DESCRIPTION

This disclosure describes various embodiments of thermally conductive and electrically insulating materials for thermal management enhanced with BNNTs, including thermal interface materials (TIMs) incorporating BNNTs into a composite matrix, as well as methods of fabricating BNNTs for inclusion in thermally conductive and electrically insulating materials for thermal management. It should be appreciated that the following embodiments and examples are demonstrative of the present approach, and are not intended to limit the scope of the present approach.

The present approach provides BNNT materials especially suited for use as thermal management materials for, e.g., TIMs, including processes for making these BNNT materials from as-synthesized BNNT materials. Described herein are demonstrative examples of BNNT-modified TIMs, including BNNT-polymer composites for thermal management in high-power high-density electronics, and methods for fabricating BNNT-modified TIMs. Under the present approach, a TIM may take the form of a composite matrix, such as a polymer composite matrix. The composite matrix may have a matrix material, a microfiller material, and a BNNT filler material. In embodiments of the present approach, the BNNT filler material and the microfiller material may be introduced into the matrix material, to achieve a thermal conductivity from about 4 W/m·K to about 10 W/m·K, and higher, depending on the particular embodiment.

Figure 1:
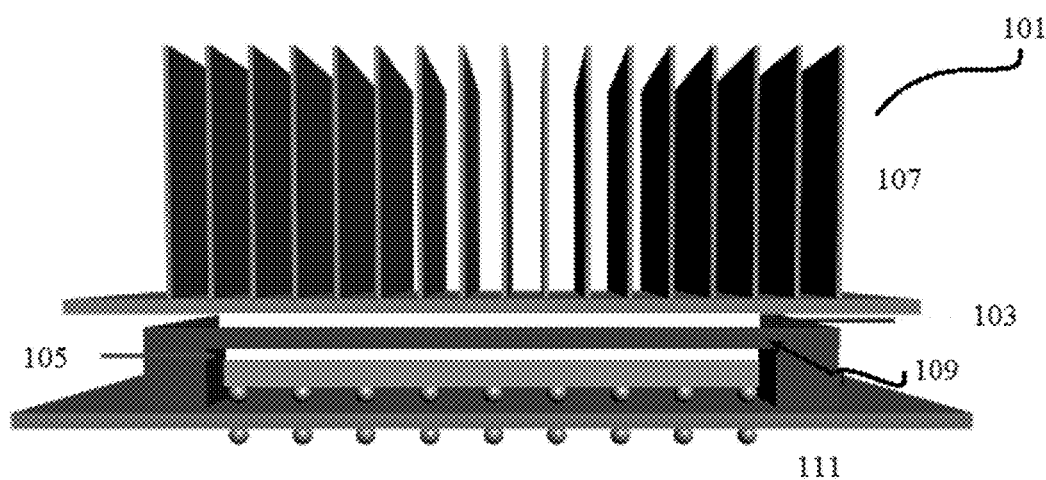
FIG. 1 shows a diagram of a demonstrative electronics package having thermal interface material layers.

As used herein, a TIM is a material that transfers heat from one component to another surface. FIG. 1 shows a diagram of a demonstrative electronics package 101, with common locations 103 and 105 for TIMs. In this example, TIM 103 is positioned between heat sink 107 and chip package cover 109, and TIM 105 is positioned between chip package cover 109 and chip substrate 111. It should be appreciated that FIG. 1 illustrates one of many potential configurations of an electronics package having one or more TIMs, and that the present approach is not intended to be limited to the configuration shown. The TIMs fill air gaps between surfaces and prevent separation due to different coefficients of thermal expansion (CTE) values between the component and surface. Beyond their ability to transfer heat between surfaces, TIMs are often highly specialized to fit a particular application with optimized properties such as thixotropicity and dielectric strength. The development process of a commercial TIM requires addressing several parameters, both physical and chemical, considering stability of the material in addition to thermal conductivity. There are currently a limited selection of dielectrics TIMs available commercially, and none deliver the combination of multifunctional properties that BNNTs can impart on a material.

Those of ordinary skill in the art will appreciate that TIMs may come in a variety of forms, such as, for example, adhesives, pastes, underfills, gap-fills, and gap-pads, and that specific embodiments described below do not limit the present approach to any particular form. Embodiments of a TIM according to the present approach may take any such form as suitable or required for the particular embodiment. Embodiments of BNNT-modified TIMs may include a hybrid filler composed of BNNTs and one or more microfillers, within a matrix. The matrix may be a polymer matrix. Examples of matrices include, but are not limited to, epoxy as adhesives, underfills and laminate substrates; cyanoacrylate as adhesive and underfills; silicone as gap-fillers, gap-pads, and adhesives; and silicone oil as pastes. It should be appreciated that the present approach is not limited to any particular composites and matrices, such as those described below.

Under the present approach, a thermal interface material may include a matrix material, at least one microfiller, and a refined BNNT material. The refined BNNT material may be prepared from what this disclosure references as an as-synthesized BNNT material, i.e., BNNTs collected from a synthesis operation. As-synthesized BNNT materials may be considered "low quality" or "high quality," largely dependent on the synthesis process and synthesis conditions. As referred to herein, "low quality" BNNTs typically have 10 to 50 walls with aspect ratios less than 1,000 to 1, numerous breaks in the crystalline structure and may include metal impurities as a consequence of the synthesis processes. The "low quality" BNNT materials may be suitable for some embodiments of the present approach, however, they may not provide the same degree of enhancement to TIMs. On the other hand, "high quality" BNNTs are highly crystalline with higher aspect ratios. Generally, high quality as-synthesized BNNT material has nanotubes in which the number of walls ranges from 1 to 10, with most being 2-wall, 3-wall and 4-wall nanotubes, and have length to diameter ratios of typically about 10,000 to 1 or higher, and normally catalyst free, and are highly crystalline (meaning very few defects at a level of less than 1 per 100 diameters of length). High quality BNNT material may be synthesized by, for example, high temperature or high temperature high pressure (HTP) methods. U.S. Pat. Nos. 9,745,192, 9,776,865, 10,167,195, and International Patent Application PCT/US16/23432, filed Nov. 21, 2017, describe synthesis processes for high-quality BNNTs, and each is incorporated by reference in its entirety.

Figure 2:
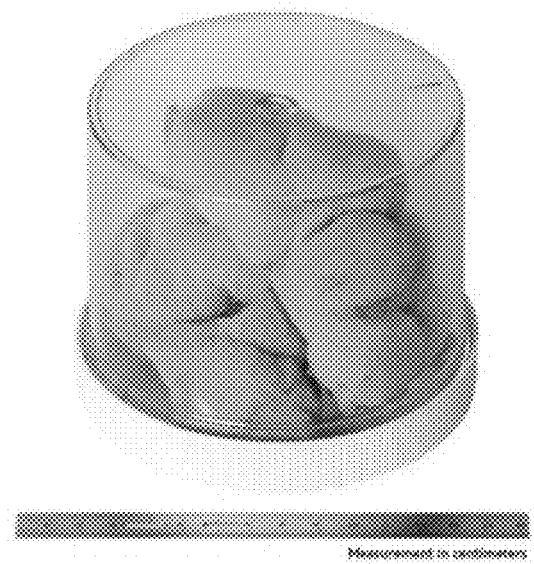
FIG. 2 is an image of as-synthesized BNNTs.

Depending on processing conditions, there may be particles of boron and a-BN, and h-BN nanocages and h-BN nanosheets present in the as-synthesized BNNT material. Depending on synthesis conditions, these non-BNNT BN allotrope components may account to from as little as about 5 percent to as high as about 95 percent of the mass of the as-synthesized BNNT material, though some synthesis conditions may result in concentrations that exceed this range. The tap density of the as-synthesized BNNT material produced by an HTP method is typically about 0.5 grams per liter (0.5 g/L), and can vary by upwards of +/−50% depending on the process parameters. For comparison, the density of h-BN is about 2,100 g/L. The as-synthesized BNNT material from HTP processes often has the appearance of a "puff ball" or "cotton ball," as can be seen in the sample from BNNT, LLC, shown in FIG. 2. Boron particles and non-BNNT BN allotrope components may be removed (i.e., significantly reduced, as there may be residual particles after removal processing) through post-synthesis refinement processes, such as those described below and in International Application No. PCT/US2017/063729, filed Nov. 29, 2017 and incorporated by reference in its entirety.

The transport of phonons along the BNNT molecules may be further enhanced by utilizing isotopically-enhanced BNNTs. Separately, both $^{10}$B and $^{11}$B enhancements provide benefits. A boron feedstock may be selected for BNNT synthesis that contains $^{10}$B and/or $^{11}$B. For example, isotopically enhanced boron is commercially available at 96% for $^{10}$B and 98% for $^{11}$B and can be used for the synthesis of BNNT by the processes discussed above and incorporated herein by reference, as synthesis processes are typically insensitive to the isotopic content of the boron.

The as-synthesized BNNT material may be processed into a refined BNNT material, to reduce the amounts of small particles of boron, a-BN, and h-BN nanocages and h-BN nanosheets present. Boron particles not encapsulated by h-BN allotropes may be removed from the as-synthesized BNNT material through the processes described below and incorporated by reference. The person of ordinary skill in the art will appreciate that in most embodiments, there will be residual boron particles remaining, and that "removing" boron particles does not entail a complete elimination of the chemical species from the BNNT material. For example, after boron removal, the residual boron may be present at less than about 20% by weight in some embodiments, less than about 15% by weight in some embodiments, less than about 10% by weight in some embodiments, less than about 5% by weight in some embodiments, less than about 3% by weight in some embodiments, and less than about 1% by weight in some embodiments.

International Patent Application No. PCT/US2017/063729, filed Nov. 29, 2017 and incorporated by reference in its entirety, describes methods for refining, or as used in the incorporated reference, purifying, BNNT material. Boron particles may be removed from the BNNT material through heating the BNNT material (e.g., the as-synthesized BNNT material in some embodiments) at a first temperature for a first duration, and in an inert gas with a hydrogen feedstock, such as water vapor. The first temperature may be a temperature of about 500-650° C., and more preferably a temperature of about 550-600° C. The BNNT material may remain at the first temperature for a given time, preferably about 3 minutes to about 12 hours, and in some embodiments about 4 minutes to about 60 minutes, and in some embodiments, about 5 minutes to about 30 minutes. The person of ordinary skill should appreciate that the appropriate heating duration for a particular as-synthesized BNNT material may be determined through routine experimentation, without departing from the present approach. In some embodiments, the inert gas may include nitrogen, or it may consist of nitrogen, or it may consist essentially of nitrogen. In some embodiments, the hydrogen feedstock may be at least one of water vapor and hydrogen gas. In some embodiments, the amount of water vapor in the nitrogen gas may be controlled by using a dry nitrogen gas and bringing the dry nitrogen gas to saturated water vapor conditions at a temperature of 30-120° C., for example. Alternatively, an oxygen-based boron removal stage may be used. The BNNT material may be heated to a first temperature for a first duration in an oxygen-rich environment to remove boron. The first temperature for the oxygen-rich stage may be, preferably, about 500-650° C., or in some embodiments about 550-600° C., or in some embodiments about 550+/−10, and the first duration may be, preferably, about 3 minutes to about 12 hours, and in some embodiments about 4 minutes to about 60 minutes, and in some embodiments, about 5 minutes to about 30 minutes. For some forms of the as-synthesized BNNT material, the boron particles that are encapsulated within h-BN nanocages are not affected by this refining process, however they are removed from the BNNT material when the h-BN nanocages are removed. It should be appreciated that in some embodiments, as much of the boron particles should be removed as is economically feasible. When the weight percent of the free boron particles present in the refined BNNT material becomes lower than at least about 20 weight percent, and in some embodiments preferably less than about 10 weight percent, and in some embodiments more preferably less than about 5 weight percent, and even more preferably less than about 3 weight percent, the material becomes more advantageous for inclusion in thermal management materials. For example, in some prototypes of a refined BNNT material, the free boron particles comprise approximately 1.0 weight percent. Other embodiments may need a lower weight percentage, to include a weight percent below 1 weight percent, and some embodiments may need an even lower weight percent of free boron particles.

Following boron removal, h-BN allotropes may be removed from the BNNT material through the processes described below and incorporated by reference. The person of ordinary skill in the art will appreciate that in most embodiments, there will be residual h-BN particles remaining, and that "removing" h-BN species does not entail a complete elimination of those chemical species from the BNNT material. For example, after h-BN allotrope removal, the residual h-BN allotropes may be present at less than about 40% in some embodiments, less than about 25% in some embodiments, less than about 10% in some embodiments, less than about 5% in some embodiments, less than about 3% in some embodiments, and less than about 1% in some embodiments. Analysis of 10 representative HR-SEM micrographs at 20,000× magnification of a refined BNNT material can be used to determine the relative fraction of BNNTs versus other h-BN nano-allotropes in the refined BNNT material. BNNTs provide the greatest improvement for enhancing thermal conductivity, but the other h-BN allotropes contribute to the improved thermal conductivity by a combination of packing density of nano particles with the microfiller and the higher thermal conductivity of h-BN nano particles compared to the thermal conductivity of the matrix material.

In some embodiments, BN compounds may be removed by heating the BNNT material at a second temperature for a second duration. For some embodiments, the temperature may be increased from the first temperature, after the first duration, to a second temperature, for a second duration, to remove BN compounds following boron removal. The second temperature is about 650-800° C., and in some embodiments about 675-725° C. The second duration is preferably about 3 min to 12 hours, and may be about 4 min to 120 min, and in some embodiments may be about 5 min-120 min, and in some embodiments may be about 10 min-100 min. Optimum temperature and duration parameters will depend on the BNNT material, and it should be appreciated that the person of ordinary skill in the art may determine effective temperatures and durations through simple experimentation. In most embodiments, a-BN particles will be removed first, and then the h-BN nanosheets are removed, along with some h-BN nanocages, and after some time, some of the BNNTs will be removed. The amount of allotrope removal depends on the time of exposure of the BNNT material to the process. In practice, there is a balance between the fraction of the BN allotropes removed and the final yield for the refining process. Commercial efficiency may determine the acceptable content, as long as the refined BNNT material meets the requirements for the desired embodiment. As discussed in the literature, acids such as nitric acid can also do a similar process, however the acids tend to attack the BNNTs earlier in the process, reducing the quantity and quality of BNNTs and consequently their thermal conductivity. For most embodiments, acid-based removal of BN allotropes are not preferred because of the impact on the BNNTs.

In some embodiments, the BNNT material may include borates. Borates may be removed through heating at a third temperature for a third duration, preferably about 500-650° C., and the for about 0.16-12 hours. In some embodiments, borates removal may occur after BN removal, such that the heating temperature is reduced from the second temperature to the third temperature.

The removal process may be used to remove sufficient amounts of boron, BN species, and borate species, as needed for a given embodiment. Following removal of boron, and in some embodiments also after removing BN species, and in some embodiments also removing borate species, the as-synthesized BNNT material may be referred to as a refined BNNT material. Characterizing the refined BNNT material may be useful step in preparing the nanotubes for thermal management applications. For example, at each stage in the refining process, high resolution scanning electron microscopy (HR-SEM) is an efficient technique for observing the size distribution of BN allotropes, BNNTs, and BNNT agglomerations within the material. Analysis of representative HR-SEM micrographs can be used to determine the relative fraction of BNNTs versus other h-BN nano-allotropes at various process stages, as well as at various process conditions, to identify the conditions that produce a refined BNNT material suitable for a particular embodiment. Also, analysis of representative HR-SEM micrographs can be used to determine the size distributions of smaller BNNT agglomerations (<1 µm). Optical microscopes can be used to determine the size distribution of the larger BNNT agglomerates, i.e. those larger than a few microns. If desired, these size distributions can then be utilized to estimate the volume distributions, using techniques available to those of ordinary skill in the art.

After removal of boron and h-BN allotropes, the refined BNNT material may be deagglomerated. As-synthesized BNNT material has agglomerations of BNNTs, often mixed with other h-BN allotropes and boron particles. The size and relative mass of BNNTs in agglomerations may depend on a variety of factors, such as the starting boron feedstock, the synthesis process and operating conditions, and the collection technique. The methods described above for boron removal generally do not affect the BNNT agglomerations. Also, the additional refinement described above for removing BN allotropes generally does not affect the BNNT agglomerations, apart from reducing any BN allotropes present in the agglomerations.

The agglomerations negatively impact BNNT dispersion in the matrix material, and reduce the effective thermal conductivity. The person of ordinary skill in the art will appreciate that the term "deagglomerate," as used herein, refers to a reduction in the size of agglomerations and mass of BNNT and other h-BN allotropes remaining in agglomerations. BNNT agglomerations negatively impact the thermal conductivity and dispersibility in most microfiller materials. As a consequence, the performance goals of most thermal management materials will require reducing the size and relative mass of BNNT agglomerations. This disclosure refers to a BNNT material that has been processed to reduce agglomeration size and mass as a "deagglomerated BNNT material," for convenience. Deagglomerated BNNT material will have better dispersability and better thermal conductivity than refined BNNT material with BNNT agglomerations. A BNNT material may be deagglomerated in solution by stirring, sonication, or a combination of stirring and sonication, among other mechanical means used in the art to deagglomerate particles in solution. The deagglomeration process may proceed in solution, such as an alcohol or a low molecular weight hydrocarbon solvent.

The extent of a deagglomeration process can be observed and quantified through the use of optical microscopy for observing the volume ratio of BNNT agglomerations larger than 3 micrometers in size. It should be appreciated that the BNNTs are dispersed in the matrix material. HR-SEM and/or high-resolution transmission electron microscopy may be used to quantify the distribution of BNNTs present in the deagglomerated BNNT material as individual nanotubes, and the distribution of BNNTs and other h-BN allotropes remaining in agglomerations. As used in this disclosure, a deagglomerated BNNT material is a BNNT material that, when dispersed into the target polymer matrix, has less than 1% of remaining agglomerations with two dimensions that exceed 300 µm, as determined through at least 10 representative optical microscope images, obtained at 10× magnification, of the dispersed BNNT material. For example, an optical image at 10× or greater magnification may be used to identify the percentage of agglomerations visible in the image that have a length and a width exceeding 300 µm. This specification uses the 10 representative optical microscope methodology to determine whether the fraction of agglomerations remaining within a dispersed deagglomerated BNNT material is within the size threshold. In some embodiments, for example, a deagglomerated BNNT material has less than 1% of remaining agglomerations have two dimensions that exceed 300 µm, and in some embodiments, less than 5% of remaining agglomerations have two dimensions that exceed 200 µm, and in some embodiments, less than 10% of remaining agglomerations have two dimensions that exceed 150 µm, and in some embodiments, less than 15% of remaining agglomerations have two dimensions that exceed 100 µm. As additional examples, in some preferable embodiments, less than 20% of any remaining agglomerations in the BNNTs have two dimensions that exceed 50 µm, and in some preferably embodiments, less than 25% of any remaining agglomerations in the BNNTs have two dimensions that exceed 25 µm. It should be appreciated that the representative optical microscope methodology described above may be used to determine the conditions that achieve sufficient deagglomeration for a particular embodiment.

For some embodiments, the size distribution of remaining agglomerations may call for no more than 1% of agglomerations with two dimensions exceeding 300 microns, no more than 5% of agglomerations with two dimensions exceeding 200 microns, and no more than 15% particles with two dimensions exceeding 100 microns. In some embodiments, the size distribution of remaining agglomerations may call for no more than 1% of agglomerations with two dimensions exceeding 300 microns, no more than 15% of agglomerations with two dimensions exceeding 100 microns, and no more than 20% particles with two dimensions exceeding 50 microns.

Figure 3A:
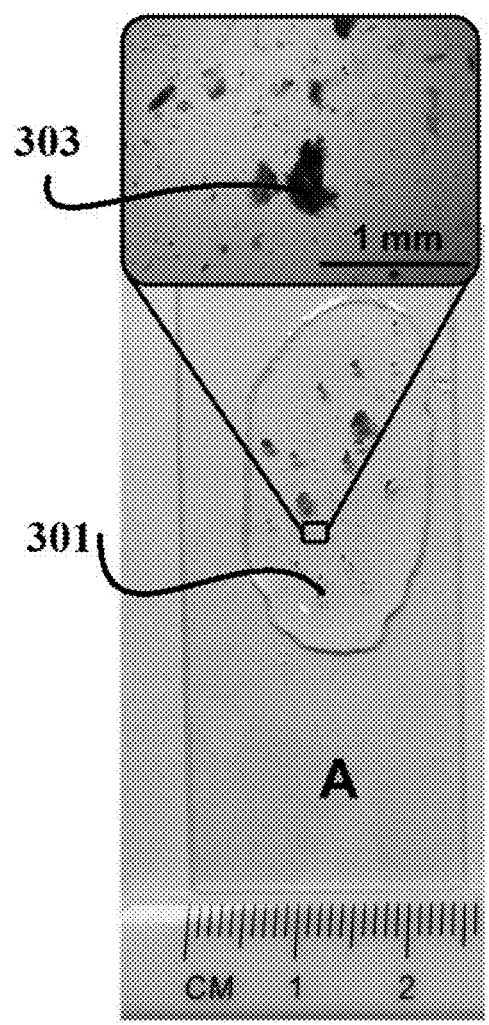
FIG. 3A is an image of a refined BNNT material in dispersion, with an inset at 8× magnification.
Figure 3B:
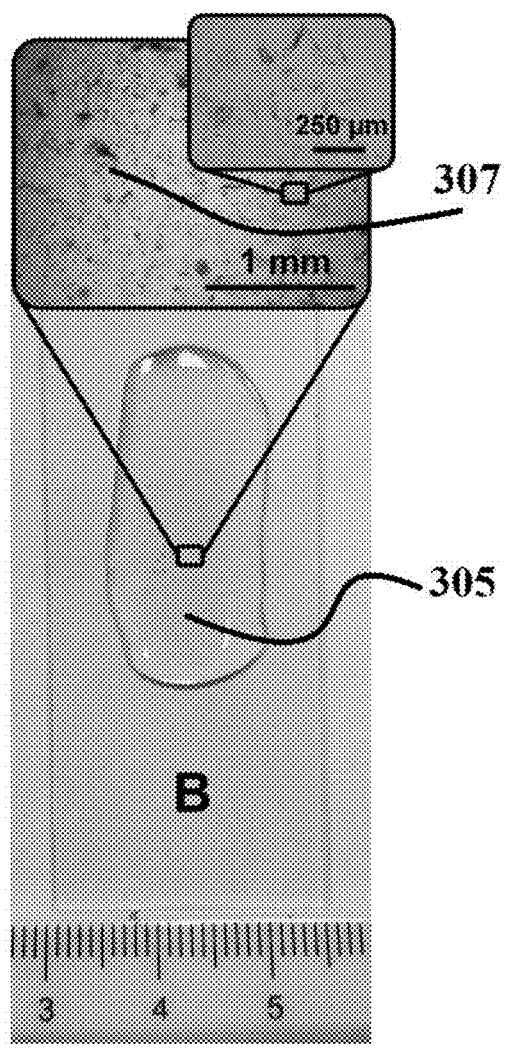
FIG. 3B is an image of deagglomerated BNNT material in dispersion, with insets at 8× and 20× magnification.

Deagglomeration and surface modification under the present approach significantly improves the dispersion of BNNTs, such as as-synthesized BNNT material and/or refined BNNT material, in a polymer matrix. FIG. 3A shows an optical image of refined BNNT material 301 in solution with BNNT agglomerations 303 visible in both the normal magnification and at 8× as shown in the inset. FIG. 3B shows an optical image of deagglomerated BNNT material 305 after deagglomeration according to the present approach. Each image includes an inset at 8× magnification, and FIG. 3B includes a second inset at 20× magnification, showing smaller agglomerations 307. These images demonstrate the effects of deagglomeration on BNNT dispersion within the polymer matrix. The BNNT material shown in FIG. 3A includes large agglomerations 303 that are visible to the naked eye. As-synthesized BNNT material was refined to remove the majority of elemental boron as described above, and then stirred in solution with toluene and vacuum dried to remove solvent. The resulting refined BNNT material was then dispersed into epoxy resin with a planetary mixer, producing the observable agglomerations 303 visible in FIG. 3A. The FIG. 3B dispersion resulted from the same as-synthesized BNNT material being refined to remove the majority elemental boron, deagglomerated by a combination of stirring, shaking, and sonication, then surface-modified with short alkyl chains. The surface-modified deagglomerated BNNT material was then lyophilized before dispersion into epoxy resin using the same planetary mixer conditions as the dispersion in FIG. 3A. As can be seen in FIG. 3B, the deagglomerated BNNT material more readily dispersed into the epoxy matrix, having few agglomerations visible to the naked eye. The agglomerations 307 present in the FIG. 3B dispersion are significantly smaller than the agglomerations in the FIG. 3A dispersion. Accordingly, the deagglomerated BNNT material with surface modifications according to the present approach has significantly improved dispersibility in the polymer matrix. Digital image processing techniques can determine the agglomeration and the deagglomeration size distributions.

In some embodiments, the deagglomeration process may be followed with lyophilization to further improve the deagglomeration and retain the distribution of individualized BNNTs as the deagglomerated BNNT material returns to a solid state during solvent removal without lyophilization. The refined BNNT material may be deagglomerated as described above, e.g., through stirring, sonication, or a combination of stirring and sonication, in a solvent (such as, for example, water, alcohol, toluene, hydrocarbons, or a mixture thereof). It should be appreciated that the person of ordinary skill in the art may determine the appropriate process parameters (e.g., intensity, time, etc.) for a given embodiment. Generally, the process should continue until the deagglomerated BNNT material has the size and relative mass of BNNT agglomerations (or a sufficient distribution of individualized BNNTs) for the desired embodiment, and at least until less than 1% of remaining agglomerations have two dimensions that exceed 300 µm. Known methods for solvent removal may be used. For example, the solvent may be removed via filtration, evaporation, and/or centrifugation and decanting, and if desired may be followed by the addition of water. Alternatively, if the solvent is an alcohol, water can be directly added to dilute the mixture. A combination of sonication and shaking may be used to disperse the BNNTs in solution, creating a suspension of deagglomerated BNNT material. The solution of deagglomerated BNNT material may flash-frozen. For example, the solution may be exposed to liquid nitrogen. A lyophilizer may be used for freeze-drying (i.e., sublimation of the solvent under vacuum) the solution. Prototype embodiments resulted in a deagglomerated BNNT material having a fluffy powder form after lyophilization. Although electrostatic forces may pull nanotubes into temporary agglomerations while in solid form, the lyophilized and deagglomerated BNNT material has improved dispersibility and will exhibit the reduced size of agglomerations and mass of BNNTs remaining in agglomerations upon dispersion into the matrix material.

In some embodiments, the refined BNNT material and/or the deagglomerated BNNT material, may be surface modified. For example, the BNNT material may be surface modified to improve one or more properties, such as interaction with a microfiller, and/or a matrix material. Depending on the embodiment, surface modification may be performed on the as-synthesized BNNT material, the refined BNNT material, and/or the deagglomerated BNNT material. In some embodiments, surface modification may occur during another process, such as, for example, deagglomeration. It should be appreciated that a wide variety of surface modifications may be used, depending on the particular embodiment. It should also be appreciated that a variety of process may be used. For example, some surface modification processes may occur on BNNTs in suspension. The BNNT material (e.g., as-synthesized BNNT material, refined BNNT material, or deagglomerated BNNT material) may be suspended in a solvent (such as water, toluene, alcohol, or hydrocarbons) through stirring, sonicating, and/or shaking.

As an example process, an excess of reagents containing the desired organic functional groups (typically containing a good terminal leaving group, i.e. a halogen or similar leaving group) are introduced to the suspension. The functional group may be, for example, a group that enhances dispersion with the polymer used as the matrix material. Trimethoxy and triethoxy silanes containing short alkyl chains are examples, as these groups can improve dispersibility within an epoxy matrix material. A base and/or another reagent may be included to promote reactivity of the functional group with the BNNT surface. The mixture may be stirred at ambient or elevated temperature and for a sufficient period of time, to ensure that groups present on the surface of the refined BNNTs (e.g., surface hydroxyls) have successfully reacted with the functional group reagent. In some embodiments, the reaction period may require up to about 18-24 hours. Of course, the process parameters will depend on the particular embodiment.

A variety of processes may be used to remove unreacted reagents and solvents remaining after the reaction. These include, for example, washing the surface-modified BNNTs with ambient temperature or heated solvents (water, alcohols, hydrocarbons, or other organic solvents), via filtration and/or centrifugation. The resulting surface-modified BNNTs may be dried using, for example, a vacuum oven, or may be lyophilized as described above. For example, the surface-modified BNNTs may be dispersed in water or a mixture of an alcohol and water by a combination of sonication and shaking, creating a suspension. The solution containing the dispersed surface-modified BNNTs may be flash-frozen (typically using liquid nitrogen), and the vessel containing the solution may be connected to a lyophilizer. After drying, the resulting solid state in prototypes resembled a fluffy powder form of surface-modified BNNT material. To confirm the successful surface modification of the BNNTs from this process, the presence of the functional groups attached to the surface of the BNNTs can be determined via FT-IR along with other spectroscopic techniques.

Under the present approach, a TIM may be fabricated by dispersing the deagglomerated BNNT material and at least one microfiller into a matrix material. Embodiments of the present approach may include one or more matrix materials. Matrix materials may include, but are not limited to, epoxy resins, polytetrafluoroethylene (PTFE), polydimethylsiloxane, thermoplastic polyurethane cyanoacrylates, polybenzoxazine-modified epoxy resins, nylons. It should be appreciated that the person of ordinary skill in the art will be able to determine the matrix material suitable for a desired embodiment. A number of dispersion techniques are known in the art. For example, dispersion may be accomplished through directly stirring or planetary mixing the deagglomerated BNNT material, which may in some embodiments be lyophilized and/or surface modified, into the matrix material suitable for the thermal management material and performance requirements. In some embodiments the BNNTs may be dispersed in the matrix material with noncovalent surface modifiers, such as polymers and surfactants.

Embodiments of the present approach may include one or more microfiller particles, also referred to as microfillers. Selection of suitable microfillers may depend on the desired embodiment, but as examples, microfillers may be dielectric fillers of various sizes and shapes, like h-BN platelets and composite spheres, diamond powders, alumina spheres. In some embodiments, microfillers may be electrically conductive such as copper, silver, or graphite particles. Multiple microfillers may be used in some embodiments. The resulting microfiller(s) preferably have a distribution of particle sizes that allow for an increase total in the total solids loading, weight percentage, and packing density. For example, the microfiller particles may have average sizes from 1-100 µm, and typically range from 10-50 µm.

In one embodiment of the present approach, a loading above 80 wt % of BNNT in a polymer composite reached an effective thermal conductivity of about 5.9 W/m·K. In other embodiments, thermal conductivities of about 3.61 W/m·K (35 wt % BNNT) and about 3 W/m·K (30 wt % BNNT) were achieved by infusing BNNTs with polystyrene and epoxy resin. These embodiments relied on as-synthesized BNNTs, unrefined BNNT material that still contains elemental boron in the form of boron nanoparticles on the scale of 20-50 wt %. Further refinement, and/or surface modification of the BNNTs may be used to further enhance the BNNT's dispersion in the TIM. Additionally, lower viscosity fillers may be used for improving TIM performance. The resultant combinations facilitate achieving thermal conductivity of the BNNT network by increasing contact between filler particles and avoiding thermal transport through the polymers that form the matrix. A similar effort resulted in the enhanced structural performance of the BNNT-fiberglass-epoxy-B4C composites.

Figure 4:
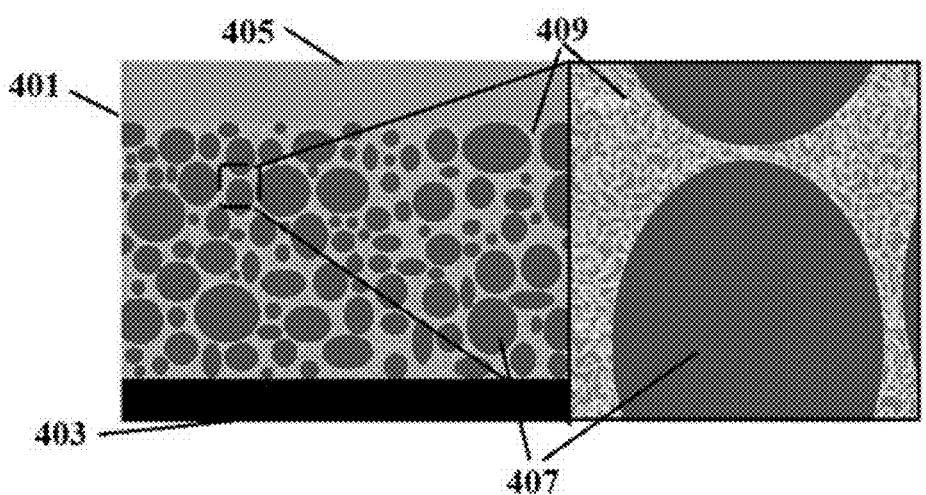
FIG. 4 illustrates a thermal interface material between a silicon die and a heat spreader, according to an embodiment of the present approach.

A BNNT-modified TIM has increased packing density and improved phonon transport efficiency, resulting in high thermal conductivity as shown in FIG. 4, which under the present approach may include refined and deagglomerated BNNTs to enhance heat transport through the TIM. FIG. 4 illustrates an embodiment of a TIM 401 between silicon die 403 and a heat spreader 405, and is not to scale nor intended to suggest any relative particle sizes or loading. The interparticulate space between microfiller particles 407 includes BNNTs 409. Considering that the thermal conductivity of typical microfillers is two or more orders greater than the thermal conductivity of the polymer matrix, the inter-particulate space and the interfaces between BNNTs and microfillers present areas for improvement. A major limitation to efficient heat transfer (and improving the high thermal conductivity) in a composite TIM is the high thermal resistance, or inefficient heat transfer, between microfiller particles. The thermal resistance is high at the interfaces between filler particles because of (1) gaps between particles of just low thermal conductivity matrix material and (2) phonon energy mismatch Inclusion of high thermal conductivity BNNTs thermal transport within the TIM by improving the packing density between filler particles. Heat transfer in non-metals, including composites, results from phonons traversing across the TIM, through matrix and microfiller particles. The optimal performance for many embodiments occurs when there is a multi-scale distribution of microfiller particles in the TIM and the net filler loading is within the range of 50-90 wt %. However, some embodiments may experience optimal performance outside of these loadings.

BNNTs have estimated thermal conductivity >3,000 W/m·K, nearly eight times the thermal conductivity of copper. BNNTs increase the viscosity of epoxies, silicone oil, cyanoacrylates and similar materials with only a few percent loading. While BNNTs generally have properties that make them useful from a thermal management perspective, the quality and characteristics of BNNTs have a significant impact on the effectiveness as a dielectric thermal management material. Compared to lower quality BNNTs produced by low temperature methods such as ball milling of chemical vapor deposition (CVD, high-quality BNNTs have fewer walls, smaller diameters, and fewer crystalline defects. As a result high-quality BNNTs have high thermal conductivity. The process for manufacturing the as-synthesized BNNT material has influence on the quality and characterization of the BNNTs. Among the various forms of as-synthesized BNNTs, the high-quality, highly-crystalline BNNTs manufactured by BNNT, LLC, using its patented catalyst-free, high-temperature process average 2-4 walls. The length of these BNNTs range from 100 s of nm to 100 s of µm, with average length of 4 µm within diameters between about 2 nm and about 15 nm. Low quality BNNTs typically range from 10-50 walls and only 50-100 nm in diameter with numerous defects in the structure, and depending on the specifics, may not be suitable for some embodiments of the present approach.

It should be appreciated that synthesis processes may be modified to tune BNNT materials to have specific characteristics. For example, various conditions for catalyst-free, high-temperature, and high-pressure processes may be manipulated, such as (but not limited to): the size of the boron melt, the nitrogen pressure, the speed of the nitrogen flow field over the boron melt, the heat distribution into to melt, the temperature distribution of the nitrogen gas, and the shear velocity distribution of the nitrogen gas about the melt. Those of ordinary skill in the art should recognize that these are examples that may or may not apply to every synthesis process, and that each synthesis process will provide certain conditions that may be tuned to impact the as-synthesized BNNTs.

Figure 5A:
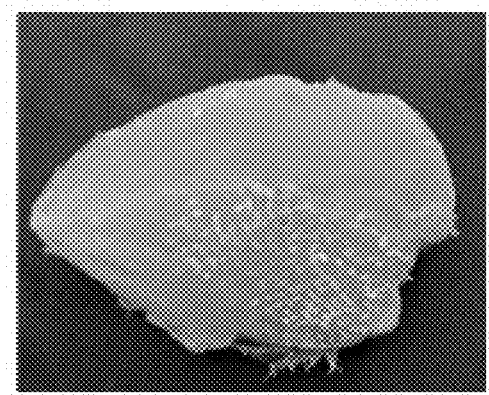
FIG. 5A shows an as-synthesized BNNT material produced from a catalyst-free, high-temperature, high-pressure method.
Figure 5B:
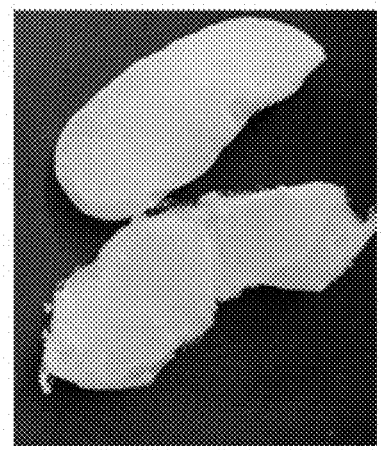
FIG. 5B is an image of the same as-synthesized BNNT material following the removal of boron and a-BN particles.

As described above, an as-synthesized BNNT material may be refined to remove, i.e., reduce the amount of, various boron species. FIGS. 5A and 5B show two BNNT materials. The material in FIG. 5A is an as-synthesized BNNT material produced from a catalyst-free, high-temperature, high-pressure method, and the material in FIG. 5B is the same as-synthesized BNNT material following the removal of boron particles. The refined BNNT material in FIG. 5B has a boron particulate content of less than about 5 wt %. The impact of the boron removal is visible through the distinct color change from the brown as-synthesized BNNT material in FIG. 5A, to the blue/white of the refined BNNT material 303. In addition, the surface area, as measured by BET, increases by 10-100% in the purified material.

Table 1 lists examples of refined BNNT material, with selected material characterizations. The refined BNNT materials are manufactured by BNNT, LLC.

TABLE 1

Demonstrative characteristics of refined BNNT material from BNNT, LLC

| Product | BNNT | h-BN nanocages (nm) | h-BN nanosheets |
|---|---|---|---|
| P0G | usually connected to nodes of h-BN nanosheets | 2-10; very few | very large fraction forming nodes |
| P1G | often connected to nodes of h-BN nanosheets | 5-30; some | frequent and often forming nodes |
| P2G | some connections to nodes of h-BN nanosheets and to h-BN nanocages | 20-60; common | occasional and forming some nodes |
| P3G | some connections to nodes of h-BN nanosheets and to h-BN nanocages | 20-70; very common | occasional and forming some nodes |

Figure 6A:
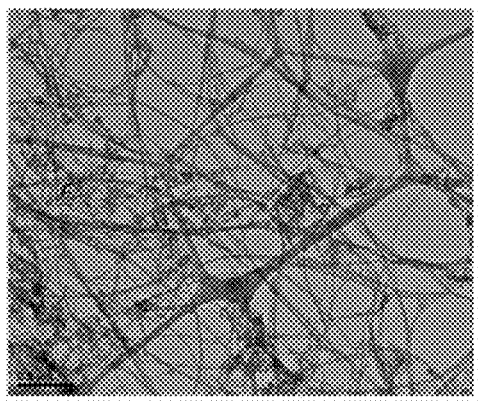
Figure 6A:
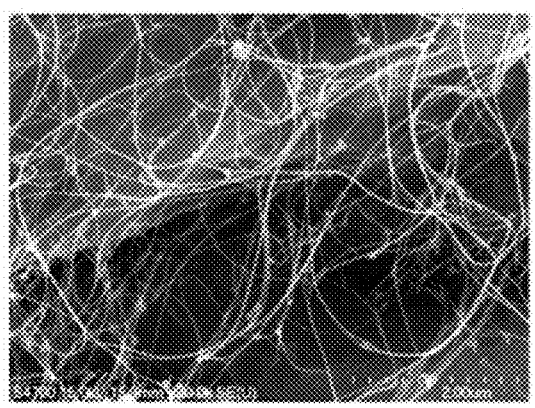

In general, BNNTs are roughly 50% by mass of P1G and P2G, 30% of by mass of P3G, and less than 30% for P0G. The BNNT materials have nanotube networks that extend to lengths on the order of 10 µm. FIG. 6A shows an SEM image of a BNNT material, and FIG. 6B shows a TEM image of a BNNT material. In these images, the BNNT material is P2G, from BNNT, LLC. Visible particles of h-BN nanocages and a few h-BN nanosheets can be seen throughout the refined BNNT material.

Figure 7A:
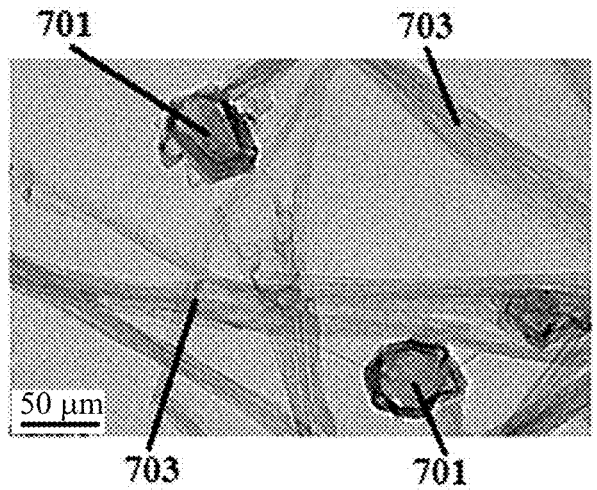
FIGS. 7A and 7B are TEM images of, respectively, h-BN nanocages and h-BN nanosheets present among BNNTs.
Figure 7B:
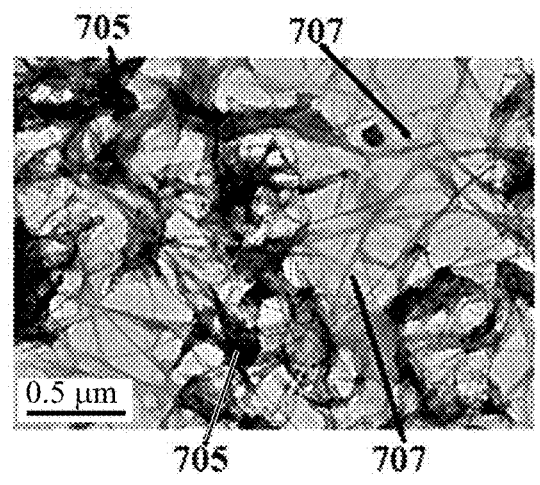

With respect to BNNT materials used in prototypes described herein, the h-BN nanocages typically have about 3 to about 15 layers, and the h-BN nanosheets typically have about 1 to about 10 layers. The h-BN nanosheets have dimensions on the order of several hundred nm to multiple µm. FIG. 7A shows a TEM image of h-BN nanocages 701 present among BNNTs 703, and FIG. 7B shows h-BN nanosheets 705 present among BNNTs 707. The refined BNNT material shown in FIGS. 7A and 7B is the P0G material referenced above, from BNNT, LLC Under the present approach, a TIM may include one or more microfiller materials. Microfillers suitable for thermal management materials are commercially available. Example include, but are not limited to, electrically-insulating microfillers such as aluminum nitride (AlN), aluminum oxide ($Al_2O_3$), boron nitride (BN), diamond, and silicon nitride ($Si_4N_3$). The microfiller material may include particles of various sizes. In some embodiments, a broad size distribution of microfiller particles may be used to optimize the thermal network through increasing the volume loading percentage. Certain 2-D microfillers, such as BNNSs combined with nanofibrillated cellulose (NFC) have been shown to have exceptional thermal conductivity in the plane of the microfillers' alignment, and may be suitable for some embodiments.

Currently available thermally-conductive and electrically-insulating interface materials contain high loadings of fillers, on the order of 70 to 90 percent by volume, and only achieve about 1-6 W/m·K. Thermal conductivities as high as 30 W/m·K have been achieved in a highly-loaded BN-filled adhesive including polybenzoxazine (PBz) phenolic resin, though values ranging from 0.5 to 5 W/m·K are more common for BN-filled adhesives. The PBz phenolic resin used in the 30 W/m·K material had poor mechanical and adhesion properties, but may be suitable in some embodiments. For example, PBz may be included in some embodiments as an epoxy additive.

Figure 8:
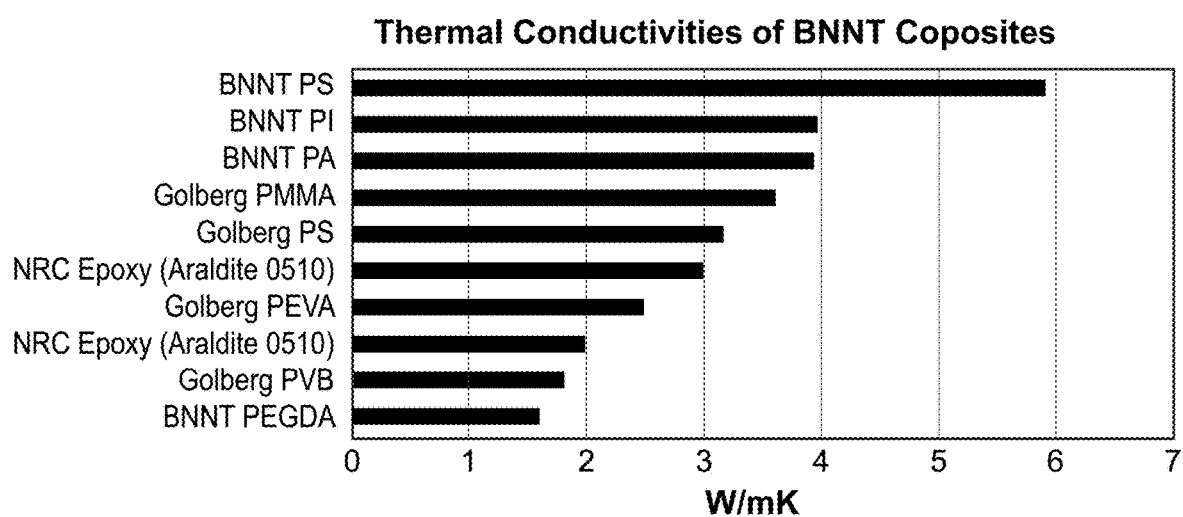
FIG. 8 shows published values of thermal conductivity for various BNNT polymer composites.

FIG. 8 shows published values of thermal conductivity for various BNNT polymer composites. To date, the highest thermal conductivity achieved (5.9 W/m·K) with BNNT modified polymer matrices has been in polystyrene (PS), by the team at BNNT, LLC. Polymer-bound BNNT ceramic composite mixtures have maintained their adhesive properties at loadings greater than 70 wt %.

Under the present approach, the combination of BNNTs and multiple sizes of microfillers dispersed within the polymer matrix improves thermal conductivity for the thermal management material. Particle sizes range from several nanometers for BNNT diameters, to multiple micrometers for the BNNT lengths, to tens of micrometers for the microfiller particles. The size distribution creates networks that efficiently move heat across macro-scale structures.

In some embodiments, microfillers may include boron nitride, diamond powders, aluminum nitride, and aluminum oxide. However, high-frequency RF TIMs often require the dielectric constant to be minimized. Spherical aluminum nitride and aluminum oxide advantageously have a relatively minimal impact on viscosity, but poorer RF performance compared to BN and diamond.

Diamond powder has high thermal conductivity; however, its hardness and inability to pack densely, due to its irregular shape, prevents it from being used in TIMs with thin bond line thicknesses or abrasion-sensitive applications.

Embodiments of the present approach may employ one or more polymer materials. For example, epoxy adhesives may be used in some embodiments. Matrix materials may include, but are not limited to, epoxy resins, polytetrafluoroethylene (PTFE), polydimethylsiloxane, thermoplastic polyurethane cyanoacrylates, polybenzoxazine-modified epoxy resins, nylons.

It should be appreciated that other polymer materials may be used. Many polymer materials have thermal conductivities from 0.1 to 0.3 W/m·K. The presence of nanoscale and microscale materials in the polymer strongly affects the properties of the composite such as viscosity, strength, adhesion, etc. For example, the addition of only a few wt. percent of BNNTs in epoxy resin or silicone oil will result in pastes with significantly higher viscosities. Filled epoxy adhesives are promising TIMs in the high-power electronics industry, both within components and for attaching electronics components to thermal management components. In one embodiment, bisphenol-A resin with a short-chained amine may be used as a fast setting and hard epoxy. The viscosities of unmodified bisphenol-A neat resins range from 4,000 to 20,000 cP. Using resins with low viscosity will allow for the easiest dispersion of fillers at high loadings.

Voids negatively impact the thermal conductivity of the TIM composite. Addition of BNNTs, according to the present approach, fills the voids between microfiller particles. The BNNT material may be an as-synthesized BNNT material, a refined BNNT material, a deagglomerated BNNT material, a surface-modified BNNT material, and combinations thereof. The epoxy resin, BNNT material, and microfiller may be mixed using techniques available in the art, such as stirring, sonicating, or planetary-mixing, increase homogeneity throughout the TIM.

PBz enhanced epoxy adhesives, thermoplastic nylon multipolymer topside coatings, and PTFE high-RF (radio frequency) laminates are additional examples of TIMs that may include BNNT materials under the present approach. Higher filler volume percentages and very high thermal conductivity have been attained using PBz, as discussed above, versus typical epoxy resins. PBz is useful because of its low viscosity (20 cP) compared to epoxy resin, cures quickly, has a shelf life greater than 90 days, is very amenable to scalable processes, and has a high modulus. In some embodiments, a PBz/BNNT material composite may be combined with an epoxy or other matrix material.

Some embodiments may take the form of a top-side conformal coating, to reduce the exposure of electronic components to the local environment, including reduced degradation. The present approach may be used to improve thermal conductivity of the coating and assembly of components on a printed wiring board (PWB). A dissolved nylon multipolymer thermoplastic may be used to make a dispersed composite for spray application, as one example. BNNTs may be spray-coated onto glass fibers, aluminum, copper, stainless steel, and PTFE, to modify the substrate's surface profile and properties. This may be done by dispersing the BNNT material, which may be a refined BNNT material, in a solvent such as an alcohol, spraying the BNNT dispersion on the substrate, and then evaporating the solvent. In some embodiments, top-side coatings may be applied using a mixture of a BNNT material/microfiller and soluble, thermoplastics with low melting temperatures. The applied TIM film may flow into a conformal coating.

Current high-RF PWBs are most commonly made from microparticle-filled PTFE, with thermal conductivities of 1.5 W/m·K or less. The low thermal conductivity limits heat flow and adversely effects the $T_j$ of semiconductors. The present approach significantly improves the thermal engineering limitations of RF components and systems used for, as examples, satellite communications, navigation, and imaging. The excellent dielectric properties of BNNTs are advantageous for such applications.

PTFE/microparticle laminates are currently used commercially for high-end PWB substrates. In a method similar to adhesive application, the BNNT material/microfiller systems of the present approach may be mixed with PTFE powder. The resulting material may be compression molded, optionally under argon or another inert gas, to allow PTFE particles to melt and flow into the hybrid filler, forming a homogenous composite.

As discussed above, BNNT refinement processes, such as those described in International Patent Application No. PCT/US17/63729, filed Nov. 29, 2017, and incorporated by reference in its entirety, may be used to reduce the amount of boron particles to below one percent mass of the material. In some embodiments, high quality BNNTs, i.e. the number of walls range from one to ten (with most being two-walled and three-walled), the length-to-diameter ratios are typically ten thousand to one or higher, the BNNTs are catalyst free, and the BNNTs are highly crystalline with very few defects (less than one defect per one hundred diameters of length), will be preferred for the BNNT material.

As-synthesized BNNT materials often have a number of boron species other than BNNTs. Table 2 lists further examples as-synthesized BNNT materials available from BNNT, LLC, along with approximate boron particulate content by mass and a listing of the most dominant allotrope present, primary, and the second most common allotrope present, secondary

TABLE 2

BNNT materials synthesized at BNNT, LLC.

| BNNT material | Nano h-BN allotropes (primary, secondary) | Approx. boron particulates |
|---|---|---|
| D2 | Tubes, cages | 20% |
| Q0 | Sheets, tubes | <5% |
| Q1 | Tubes, sheets | 25% |
| Q2 | Tubes, cages | 40-50% |

Figure 9:
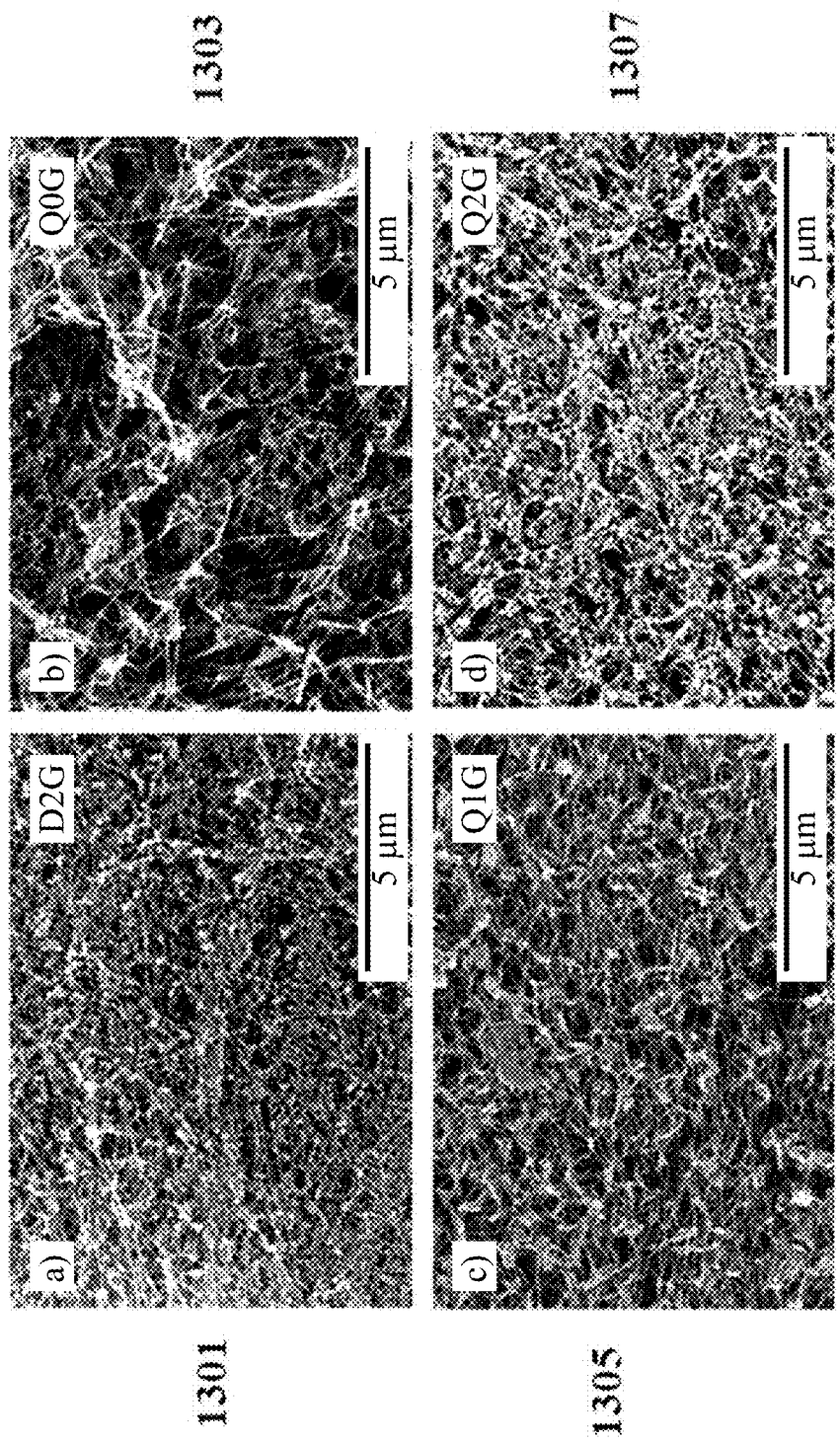
FIG. 9 shows examples of refined BNNT materials according to embodiments of the present approach.

With respect to BNNT materials from BNNT, LLC, the as-synthesized BNNT material is referred to as "beta," and refined BNNT material is referred to as "gamma." For short hand, Q2 beta is referred to as Q2B and the purified Q2 gamma material referred to as Q2G, and similarly for the other versions. FIG. 9 shows SEM images of Q0G 1301 (upper left), Q1G 1303 (upper right), Q2G 1305 (lower left) and D2G 1305 (lower right), examples of embodiments of refined BNNT materials.

The following paragraphs describe examples of the present approach applied in small-scale embodiments. In one prototype, Q1G BNNTs were included in an epoxy-based (20 wt % epoxy resin) paste with a multi-scale size distribution of diamond particles (80 wt %). The addition of Q1G BNNTs increased the thermal conductivity of the diamond/epoxy paste by nearly 30%, from 1.700±0.039 to 2.203±0.049 W/m·K. The thermal resistance also increased by nearly the same amount; however, in terms of industrial standards for thermal resistance (<0.1 in$^2$·C/W at 50 psi), this early prototype epoxy/BNNT material/diamond paste is competitive.

In additional prototype TIMs, different BNNT materials produced by BNNT, LLC were used. The addition of 1 wt % of any of the BNNT materials tested to silicone-based pastes with h-BN platelets (49 wt % h-BN) resulted in an increase in thermal conductivity, as shown in Table 4.

TABLE 4

Addition of 1 wt % of various BNNT materials synthesized at BNNT, LLC to a silicone-based (50 wt %) pastes of h-BN platelets (50 wt %).

| BNNT material | Thermal conductivity, (W/m · K) | % Increase in thermal conductivity versus control |
|---|---|---|
| None (control) | 1.070 ± 0.047 | — |
| 1 wt % D2G | 1.396 ± 0.073 | 30 |
| 1 wt % Q1G | 1.321 ± 0.035 | 23 |
| 1 wt % Q2G | 1.251 ± 0.056 | 17 |

Thermal performance depends on the BNNT material type used. For silicone-based (50 wt %) pastes containing 1 wt % of various BNNT materials synthesized by BNNT, LLC and h-BN platelets (50 wt %) the D2G material outperformed all others in terms of thermal conductivity.

TIMs have other characteristics that may be important in some embodiments, such as run-out, evaporation rate, dielectric strength, stability at high temperature, and transparency to radio frequency, among others. For applications in extreme temperature, pressure, and/or humidity environments, the tack for adhesives, temperature stability, and performance in vacuum may be important to a TIM's performance. BNNT have an abundance of unique properties that allow them to impart multifunctional nature upon TIMs made with them, including thermal stability, RF transparency, and dielectric strength, that may be advantageous for embodiments intended for extreme conditions.

In some embodiments, the surface of one or more of the components may be modified, either covalently or noncovalently, to further improve the thermal transport between particles. For example, epoxy embodiments such as described above may be enhanced with a polymer, such as PBz, that interfaces well with boron nitride (BN). The Epoxy/PBz/BNNT material/microfiller system may be applied within a thermoplastic conformal coating on the top side of a circuit board. The system may also be mixed with PTFE to fabricate into laminate sheets for high-RF systems. In some embodiments, the surface of BNNTs may be modified by either covalent or noncovalent chemistries to improve phonon transport from BNNTs to microfiller particles. The phonon energy of the functional groups appended to the BNNT will better match that of the microfiller particles Under the present approach, the deagglomeration and dispersion of BNNTs into the matrix may have an impact on thermal performance properties. The person of ordinary skill in the art will appreciate that a wide variety of deagglomeration and dispersion techniques including but not limited to sonication, stirring, chemical treatment, and use of polymers and surfactants. While gentle techniques, such as stirring, may best preserve BNNT morphology during deagglomeration step, more aggressive treatment may be necessary to isolate individual BNNTs. Improving the dispersibility through refinement, deagglomeration, and surface modification, as described herein, improves the thermal properties of the composite material.

Some embodiments of the present approach may require the addition of polymers or surfactants to (1) aid in dispersion of individual BNNT molecules and (2) reduce the viscosity of TIM at high solid contents. For example, in some embodiments using an epoxy matrix and microfiller loadings as high as 90 wt % using spherical h-BN and nonporous diamond powders, the resultant pastes were too crumbly to provide meaningful measurements. The addition of surfactants (such as sodium dodecyl sulfate) may improve viscosity and enable higher solid contents, at the risk of increasing voids in the final composite. Spherical microfiller materials may be advantageous in some embodiments, as these particles are able to glide past one another (especially in the presence of surfactants and silicone).

An ASTM D-5470 conforming method is used to determine the through-plane pressure- and bond line thickness-dependent thermal resistance, and thus calculate thermal conductivity and contact resistance of a TIM. The method is capable of measuring both pastes and solid samples allowing the thermal performance of many embodiments to be under conditions (temperature, time, pressure, bond line thickness) that are representative of end-use.

For though-plane thermal conductivity and thermal resistance, the reference bar method is a steady-state, thermography-based measurement of thermal conductivity. In this method, the TIM composites may be applied between black Teflon films to serve as substrates and reference materials within the measurement system. Various substrates can be used to better gauge contact resistance in realistic systems (e.g. aluminum and silicon). The thermal gradient about a cross-section of the interface, may be used to determine the thermal conductivities of samples. Furthermore, the irregularity in thermal gradient caused by contact resistance can be characterized. Thermal interface resistances can be spatially separated from intrinsic thermal conductivities for samples larger than ~20 times the spatial resolution (30 microns at 20× magnification). The IR microscope records the two-dimensional temperature maps with varying power levels of the heat source. Using Fourier's law, the heat flow may be calculated from the known reference materials, and then used to measure the thermal conductivity of the sample.

In-plane thermal conductivity may be characterized using the Angstrom method, which measures the time dependent thermal diffusivity of a fiber or strip of sample. The measurement is obtained using a thermal microscope to video the heat dissipation per frame from a resistively-heated wire. To obtain thermal conductivity, values of specific heat and density may be collected through differential scanning calorimetry and dimensional analysis, respectively. Samples used for this method can be strips of composite, 1 mm wide by 3 cm long, from a 100 µm thick cast sheet.

Those of ordinary skill in the art should appreciate that embodiments of the present approach may depend on the initial BNNT synthesis process. The BNNT material resulting from a particular synthesis process will have a variety of parameters, ranging from diameter and length averages to impurity content. Such parameters may vary significantly for different synthesis processes. Those parameters, in turn, will likely impact the post-synthesis processing (such as, for example, purification, deagglomeration, surface modification, etc.) that may be appropriate to prepare a BNNT material for an embodiment according to the present approach. The examples described herein are provided as demonstrative, and should not be understood as limiting the scope of the present approach.

The terminology used herein is for the purpose of describing particular embodiments only and is not intended to be limiting of the approach. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present approach may be embodied in other specific forms without departing from the spirit or essential characteristics thereof. The disclosed embodiments are therefore to be considered in all respects as illustrative and not restrictive, the scope of the present approach being indicated by the claims of the application rather than by the foregoing description, and all changes which come within the meaning and range of equivalency of the claims are therefore intended to be embraced therein. One of ordinary skill in the art should appreciate that numerous possibilities are available, and that the scope of the present approach is not limited by the embodiments described herein.

What is claimed is:

1. A thermal interface filler comprising refined and deagglomerated boron nitride nanotubes (BNNTs) having a residual boron particle content of less than 20% by weight, and when dispersed in a polymer matrix material less than 1% of any remaining agglomerations in the refined and deagglomerated BNNTs have two dimensions that exceed 300 µm; wherein the percentage of remaining agglomerations is determined from a remaining agglomeration size distribution based on visual inspection of an optical microscope image at 10× magnification of the refined and deagglomerated BNNTs when dispersed in the polymer matrix material.

2. The thermal interface filler of claim 1, wherein the residual boron particle content is less than 10% by weight.

3. The thermal interface filler of claim 1, wherein the residual boron particle content is less than 3% by weight.

4. The thermal interface filler of claim 1, wherein less than 5% of any remaining agglomerations in the refined and deagglomerated BNNTs when dispersed in a polymer matrix material have two dimensions that exceed 200 µm.

5. The thermal interface filler of claim 1, wherein less than 10% of any remaining agglomerations in the refined and deagglomerated BNNTs when dispersed in a polymer matrix material have two dimensions that exceed 150 µm.

6. The thermal interface filler of claim 1, wherein the residual boron particle content is less than 3% by weight, and less than 5% of any remaining agglomerations in the refined and deagglomerated BNNTs when dispersed in a polymer matrix material have two dimensions that exceed 200 µm.

7. The thermal interface filler of claim 1, wherein the residual boron particle content is less than 1% by weight, and less than 5% of any remaining agglomerations in the refined and deagglomerated BNNTs when dispersed in a polymer matrix material have two dimensions that exceed 200 µm.

8. The thermal interface filler of claim 1, wherein the residual boron particle content is less than 1% by weight, less than 1% of any remaining agglomerations in the refined and deagglomerated BNNTs when dispersed in a polymer matrix material have two dimensions that exceed 300 µm, less than 5% of any remaining agglomerations in the refined and deagglomerated BNNTs when dispersed in a polymer matrix material have two dimensions that exceed 200 µm, and less than 10% of any remaining agglomerations in the refined and deagglomerated BNNTs when dispersed in a polymer matrix material have two dimensions that exceed 150 µm.

9. The thermal interface filler of claim 1, wherein the refined and deagglomerated BNNTs comprise a residual h-BN allotrope fraction less than 40% as determined through visual analysis of an HR-SEM micrograph at 20,000× magnification of the refined and deagglomerated BNNTs.

10. The thermal interface filler of claim 1, wherein the refined and deagglomerated BNNTs comprise a residual h-BN allotrope fraction less than 25% as determined through visual analysis of an HR-SEM micrograph at 20,000× magnification of the refined and deagglomerated BNNTs.

11. The thermal interface filler of claim 1, wherein the refined and deagglomerated BNNTs comprise a residual h-BN allotrope fraction less than 10% as determined through visual analysis of an HR-SEM micrograph at 20,000× magnification of the refined and deagglomerated BNNTs.

12. The thermal interface filler of claim 1, wherein the refined and deagglomerated BNNTs comprise a residual h-BN allotrope fraction less than 3% as determined through visual analysis of an HR-SEM micrograph at 20,000× magnification of the refined and deagglomerated BNNTs.

13. The thermal interface filler of claim 1, wherein the residual boron particle content is less than 3% by weight, a residual h-BN allotrope content of the refined and deagglomerated BNNTs is less than 25% as determined through visual analysis of an HR-SEM micrograph at 20,000× magnification of the refined and deagglomerated BNNTs, and less than 5% of any remaining agglomerations in the refined and deagglomerated BNNTs when dispersed in a polymer matrix material have two dimensions that exceed 200 µm.

14. The thermal interface filler of claim 1, wherein the residual boron particle content is less than 1% by weight, a residual h-BN allotrope content of the refined and deagglomerated BNNTs is less than 10% as determined through visual analysis of an HR-SEM micrograph at 20,000× magnification of the refined and deagglomerated BNNTs, and less than 25% of any remaining agglomerations in the refined and deagglomerated BNNTs when dispersed in a polymer matrix material have two dimensions that exceed 25 µm.

15. The thermal interface filler of claim 1, wherein the filler is lyophilized.

16. The thermal interface filler of claim 1, wherein the refined and deagglomerated BNNTs have been surface modified with a functional group that improves dispersion in a polymer matrix material.

17. A BNNT-enhanced thermal interface material comprising:
a polymer matrix material;
a microfiller; and
a refined and deagglomerated BNNT material having a residual boron particle content of less than 20% by weight and less than 1% of any remaining agglomerations in the refined and deagglomerated BNNTs have two dimensions that exceed 300 µm, wherein the percentage of remaining agglomerations is determined from a remaining agglomeration size distribution based on visual inspection of an optical microscope image at 10× magnification of the refined and deagglomerated BNNTs when dispersed in the polymer matrix material.

18. The BNNT-enhanced thermal interface material of claim 17, wherein the refined and deagglomerated BNNT material is dielectric.

19. The BNNT-enhanced thermal interface material of claim 17, wherein the residual boron particle content in the refined and deagglomerated BNNT material when dispersed in a polymer matrix material is less than 10% by weight.

20. The BNNT-enhanced thermal interface material of claim 17, wherein the residual boron particle content in the refined and deagglomerated BNNT material is less than 3% by weight.

21. The BNNT-enhanced thermal interface material of claim 17, wherein less than 5% of any remaining agglomerations in the refined and deagglomerated BNNTs when dispersed in a polymer matrix material have two dimensions that exceed 200 µm.

22. The BNNT-enhanced thermal interface material of claim 17, wherein less than 10% of any agglomerations in the refined and deagglomerated BNNTs when dispersed in a polymer matrix material have two dimensions that exceed 150 µm.

23. The BNNT-enhanced thermal interface material of claim 17, wherein the residual boron particle content in the refined and deagglomerated BNNT material is less than 3% by weight, and less than 5% of any remaining agglomerations in the refined and deagglomerated BNNTs when dispersed in a polymer matrix material have two dimensions that exceed 200 µm.

24. The BNNT-enhanced thermal interface material of claim 17, wherein the residual boron particle content is less than 3% by weight, a residual h-BN allotrope fraction of the refined and deagglomerated BNNTs is less than 25% as determined through visual analysis of an HR-SEM micrograph at 20,000× magnification of the refined and deagglomerated BNNTs, and less than 5% of any remaining agglomerations in the refined and deagglomerated BNNTs when dispersed in a polymer matrix material have two dimensions that exceed 200 µm.

25. The BNNT-enhanced thermal interface material of claim 17, wherein the residual boron particle content is less than 1% by weight, a residual h-BN allotrope fraction of the refined and deagglomerated BNNTs is less than 10% as determined through visual analysis of an HR-SEM micrograph at 20,000× magnification of the refined and deagglomerated BNNTs, and less than 25% of any remaining agglomerations in the refined and deagglomerated BNNTs when dispersed in a polymer matrix material have two dimensions that exceed 25 µm.

26. The BNNT-enhanced thermal interface material of claim 17, wherein the BNNT-enhanced thermal interface material comprises about 50% to about 90% by weight of the microfiller.

27. The BNNT-enhanced thermal interface material of claim 17, wherein the BNNT-enhanced thermal interface material comprises about 0.1% to about 30% by weight of the refined and deagglomerated BNNT material.

28. The BNNT-enhanced thermal interface material of claim 17, wherein the BNNT-enhanced thermal interface material is electrically insulating.

29. A method for fabricating a BNNT-enhanced thermal interface material, the method comprising:
    refining an as-synthesized BNNT material to form a refined BNNT material having a residual boron particle content less than 20% by weight;
    deagglomerating the refined BNNT material to form deagglomerated BNNT material having less than 1% of any remaining agglomerations in the deagglomerated BNNTs when dispersed in a polymer matrix material with two dimensions that exceed 300 µm; and
    dispersing the deagglomerated BNNT material and a microfiller into a polymer matrix material;
    wherein the percentage of remaining agglomerations is determined from a remaining agglomeration size distribution based on visual inspection of an optical microscope image at 10× magnification of the refined and deagglomerated BNNTs when dispersed in the polymer matrix material.

30. The method of claim 29, wherein refining the as-synthesized BNNT material further comprises removing h-BN allotropes, such that the refined BNNT material has a residual h-BN allotrope fraction less than 20% as determined through visual analysis of an HR-SEM micrograph at 20,000× magnification of the refined BNNTs.

31. The method of claim 29, wherein refining the as-synthesized BNNT material comprises removing boron particles by heating the as-synthesized BNNT material in an inert gas at a first temperature of about 500° C. to about 650° C. and for a first duration of about 3 minutes to about 12 hours.

32. The method of claim 31, further comprising removing h-BN allotrope particles by heating the as-synthesized BNNT material at a second temperature of about 650° C. to about 800° C. for a second duration of about 3 minutes to about 12 hours.

33. The method of claim 29, further comprising lyophilizing the deagglomerated BNNT material prior to dispersing in the polymer matrix material.

34. The method of claim 29, further comprising appending at least one functional group to the surface of the deagglomerated BNNT prior to dispersing in the polymer matrix material.

35. The method of claim 29, wherein the BNNT-enhanced thermal interface material comprises about 50% to about 90% by weight of the microfiller.

36. The method of claim 29, wherein the BNNT-enhanced thermal interface material comprises about 0.1% to about 30% by weight of the refined and deagglomerated BNNT material.

* * * * *